United States Patent [19]

Schulz

[11] Patent Number: 4,905,176

[45] Date of Patent: Feb. 27, 1990

[54] RANDOM NUMBER GENERATOR CIRCUIT

[75] Inventor: Raymond A. Schulz, Manassas, Va.

[73] Assignee: International Business Machines Corporation, Armonk, N.Y.

[21] Appl. No.: 264,467

[22] Filed: Oct. 28, 1988

[51] Int. Cl.$^4$ ............................................... G06F 1/02
[52] U.S. Cl. .................................................... 364/717
[58] Field of Search .......................... 366/717; 380/46; 331/78

[56] References Cited

U.S. PATENT DOCUMENTS

| | | | |
|---|---|---|---|
| 3,557,356 | 1/1971 | Balza et al. | 364/717 |
| 3,614,399 | 10/1971 | Linz | 364/717 |
| 3,746,847 | 7/1973 | Maritsas | 364/717 |
| 3,790,768 | 2/1974 | Chevalier et al. | 364/717 |
| 4,213,101 | 7/1980 | Policand et al. | 331/78 |
| 4,348,597 | 9/1982 | Weber | 364/717 X |
| 4,545,024 | 10/1985 | Maher et al. | 364/717 |
| 4,646,032 | 2/1987 | Wheatley, III et al. | 331/78 |
| 4,684,903 | 8/1987 | Hunt et al. | 331/78 |
| 4,769,777 | 9/1988 | Bittle et al. | 364/717 |

OTHER PUBLICATIONS

F. J. MacWilliams, et al., "Pseudo–Random Sequences and Arrays," *Proceedings of the IEEE*, vol. 64, No. 12, 12/76, pp. 1715–1730.
"Integrated Circuit Compatible Ramdom Number Generator," IBM TDB, Apr. 1988, pp. 333–335.

*Primary Examiner*—Gary V. Harkcom
*Assistant Examiner*—Tan Y. Mai
*Attorney, Agent, or Firm*—John E. Hoel

[57] ABSTRACT

A very large scale integrated (VLSI) compatible, random number generator which is highly invulnerable to cryptographic attack. The invulnerability to cryptographic attack is based upon a low frequency sampling of the output of a pseudo-random number generator which is operated at a varying frequency from a free-running ring oscillator. In a first embodiment, a free-running ring oscillator is used to drive a sampled linear feedback shift register. The asynchronous, serial pseudo-random number output from the linear feedback shift register is sampled periodically, thereby introducing randomly occurring deviations from the pseudo-random number sequence. A variation of the free-running ring oscillator is employed as the pseudo-random number generator, by introducing into the feedback loop of the ring oscillator, an exclusive OR circuit which is connected so that the ring oscillator thereby produces a serial, pseudo-random number sequence. Additional uncertainty in the sequence of random numbers produced by the free-running pseudo-random number generator, is caused by the race condition which occurs at the inputs to the exclusive OR connected in the circuit.

9 Claims, 10 Drawing Sheets

D-FLIP-FLOP USED AS A
SHIFT REGISTER ELEMENT

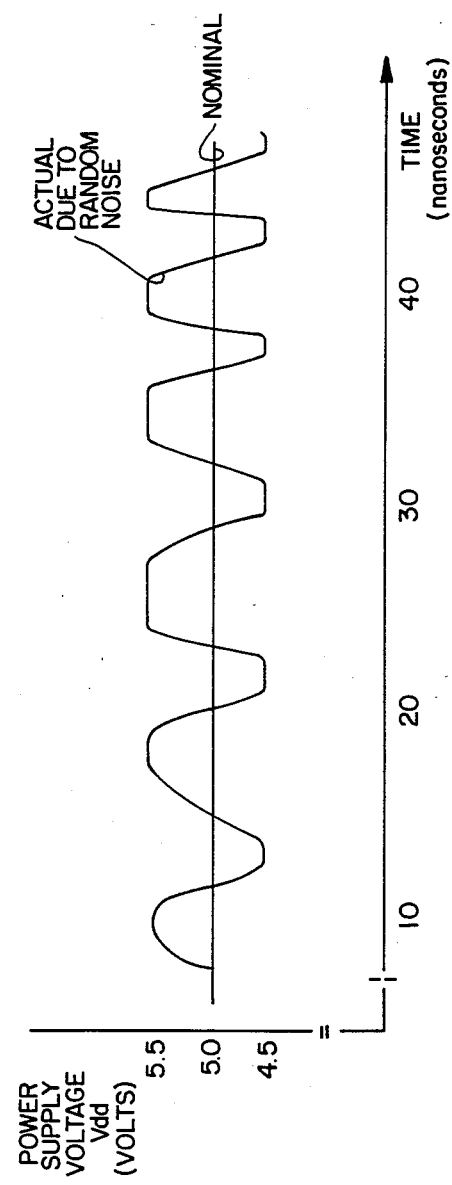

RANDOM NUMBER GENERATOR CIRCUIT

BACKGROUND OF THE INVENTION

1. Technical Field

The invention disclosed broadly relates to semiconductor circuits and, more particularly, it relates to an improved integrated circuit for random number generation.

2. Background Art

The availability of high quality random number generators is essential to the effectiveness of a cryptographic system. With the advent of very large scale integrated circuits (VLSI), and the embodiment of cryptographic systems in VLSI, it is important that component random number generators be compatible with VLSI circuit processing. Various pseudo-random number generators have been developed in the prior art, however they are all subject to attack by an eavesdropper with the intention of circumventing the cryptographic system.

One approach in the prior art to random number generation is the use of linear feedback shift registers. For example, in the book by S. W. Glomb, "Shift Register Sequences," Holden-Day, Inc., San Francisco, 1967, describes maximum length linear feedback shift registers which satisfy several criteria for randomness. Three of those criteria are, first, that in every period, the number of ones and the number of zeros do not differ by more than one. A second criterion is that in every period half the runs have a length of one, one-fourth of the runs have a length of two, one-eighth of the runs have a length of three, and so on. Furthermore, for each of these run lengths, there are as many runs of zeros as there are runs of ones. A third criterion is that the autocorrelation function is unity for a zero shift, and minus one/n for all other shifts (n being the number of shift register stages).

As Glomb and others have pointed out, the linear feedback shift register sequence is inherently periodic, which makes the output of the shift register not truly random, but only pseudo-random. Although this diminishes its utility as a component of a cryptographic system, it has been the practice in the prior art to increase the duration of the period by using a sufficiently large number of stages in the linear feedback shift register. For example, a sixty-four bit, maximum length feedback shift register, running at a clocked frequency of one MH, would not repeat itself for 585,000 years.

However, in cryptographic applications, the linear feedback shift register approach is vulnerable to attack because it is deterministic. All future and all past states can be predicted when the present state of the shift register is known. While it is true that the resulting output of the prior art linear feedback shift registers has superior statistical qualities its result is, unfortunately, totally predictable.

OBJECTS OF THE INVENTION

It is therefore an object of the invention to provide an improved random number generator.

It is another object of the invention to provide an improved random number generator which is compatible with VLSI fabrication processes.

It is a further object of the invention to provide an improved random number generator, which can produce non-deterministic random numbers of high statistical quality.

SUMMARY OF THE INVENTION

These and other objects, features and advantages of the invention are accomplished by the random number generator circuit disclosed herein. The invention is based upon low frequency sampling of the result and the variability in the frequency of oscillation of a free-running ring oscillator. Two embodiments of the invention are disclosed. In a first embodiment, a free-running ring oscillator is used to drive a sampled linear feedback shift register. Knowledge of the shift register state is kept from the outside by sampling the linear feedback shift register at a low frequency. Infrequent sampling allows the shift register information to clear out before the next sample is taken. This minimizes the amount of information about the shift register state which gets outside. Also, because of the variations in power supply voltage and other circuit parameters over time, the frequency produced by the ring oscillator, when applied as the clocking input to the linear feedback shift register, causes the linear feedback shift register to operate in an aperiodic manner. The output of the linear feedback shift register is sampled by means of a sampling flip-flop which is driven at a periodic clock rate by an external clock signal. The asynchronous serial random number output from the linear feedback shift register is sampled in a periodic manner by the sampling flip-flop, thereby introducing randomly occurring deviations from the pseudo-random number sequence. The external clocking signal is maintained at a lower sampling frequency than the frequency of the free-running ring oscillator, and this prevents the discovery of the shift register state by an attacker. Potential race conditions at the sampling flip-flop greatly complicate any attack which might have been based on an exhaustive analysis of the output of the linear feedback shift register.

In a second embodiment of the invention, a variation of the free-running ring oscillator is employed as the pseudo-random number generator, by introducing into the feedback loop of the ring oscillator, an exclusive OR circuit which is connected so that the ring oscillator thereby produces a serial random number sequence in a manner similar to that of a conventional linear feedback shift register. This embodiment also uses low frequency sampling to minimize information about the state of the generator which gets outside. By virtue of the time varying power supply voltages and other circuit parameters, the frequency of operation of the resulting free-running pseudo-random number generator causes a non-periodic serial random number sequence to be produced at its output. Additional uncertainty in the sequence of random numbers produced by the free-running pseudo-random number generator, is caused by the race condition which occurs at the inputs to the exclusive OR connected in the circuit. This can cause unpredictable skipping from a first portion of the pseudo-random number sequence to a second portion of the sequence when unbalanced delays occur in the free-running pseudo-random number generator due to variations in power supply voltage and other circuit parameters. A sampling flip-flop is connected to the output of the free-running pseudo-random number generator and the flip-flop is driven by a periodic external clock signal. Thus, in addition to the race condition which can occur at the sampling flip-flop due to the periodic sampling of the non-periodic pseudo-random number sequence from the free-running pseudo-random number generator, the unpredictable skipping from a first portion of the sequence to a second portion of the sequence due to the race conditions at the exclusive OR circuit, adds an additional level of unpredictability to the resultant random numbers generated by the circuit. This further complicates any attempt by an attacker to break the system and attempt to predict subsequent numbers produced by the circuit.

BRIEF DESCRIPTION OF THE DRAWINGS

These and other objects, features and advantages of the invention will be more fully appreciated with reference to the accompanying figures.

FIG. 14 is an example graph showing the voltage Vdd of the power supply 40 as it varies over time.

DESCRIPTION OF THE BEST MODE FOR CARRYING OUT THE INVENTION

Figure 1:
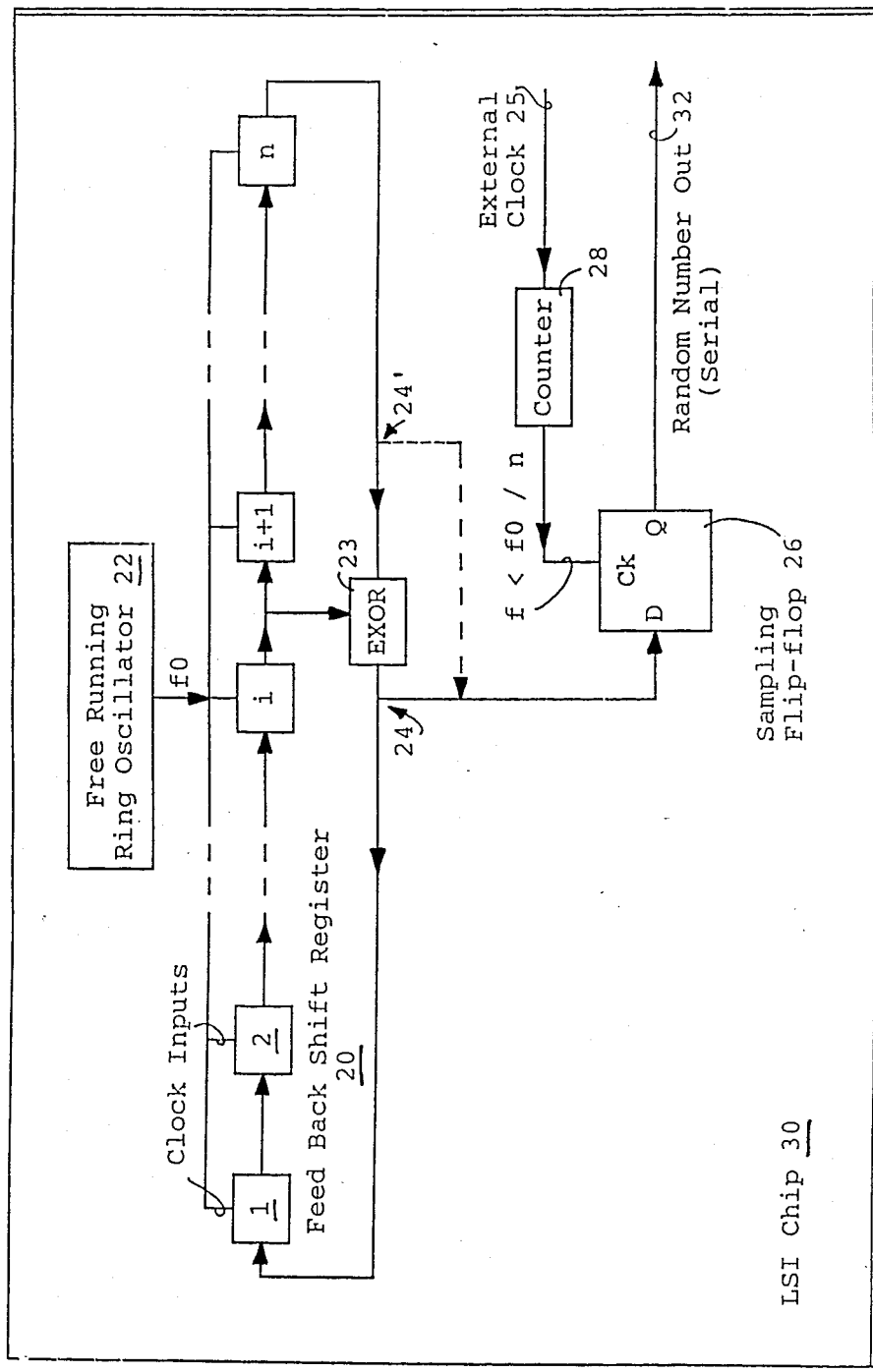
FIG. 1 is an overall logic diagram of the first embodiment of the invention, a sampled linear feedback shift register random number, generator, with a free-running ring oscillator.
Figure 2:
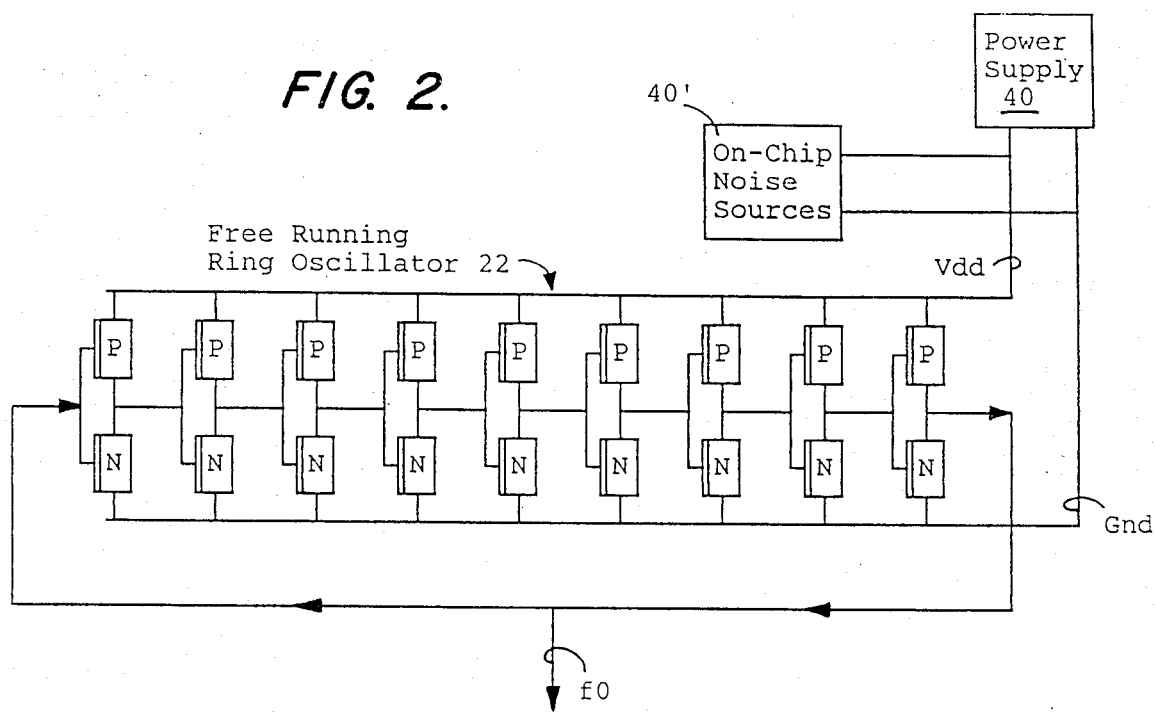
FIG. 2 is a circuit diagram of the free-running ring oscillator 22.
Figure 3A:
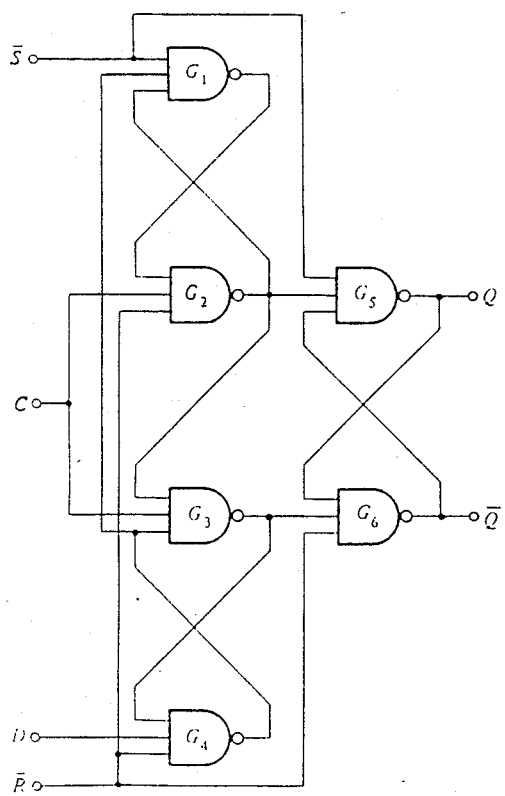
FIG. 3A shows a logic diagram of a conventional D-type flip-flop such as is used in the delay elements 1, 2, etc. of the linear feedback shift register of FIG. 1.
Figure 3B:
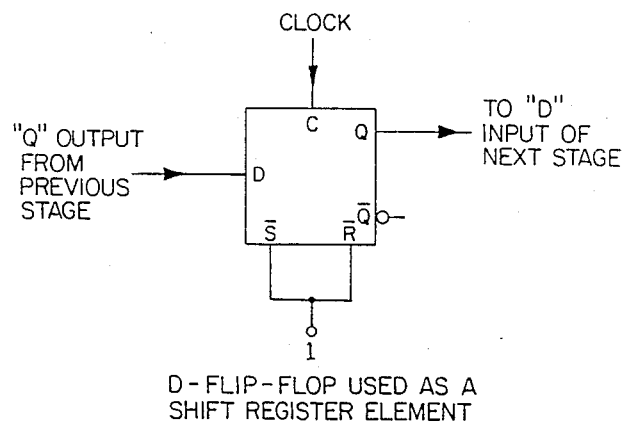
FIG. 3B shows how the D-type flip-flop of FIG. 3A is connected, when used as a shift register element.
Figure 13:
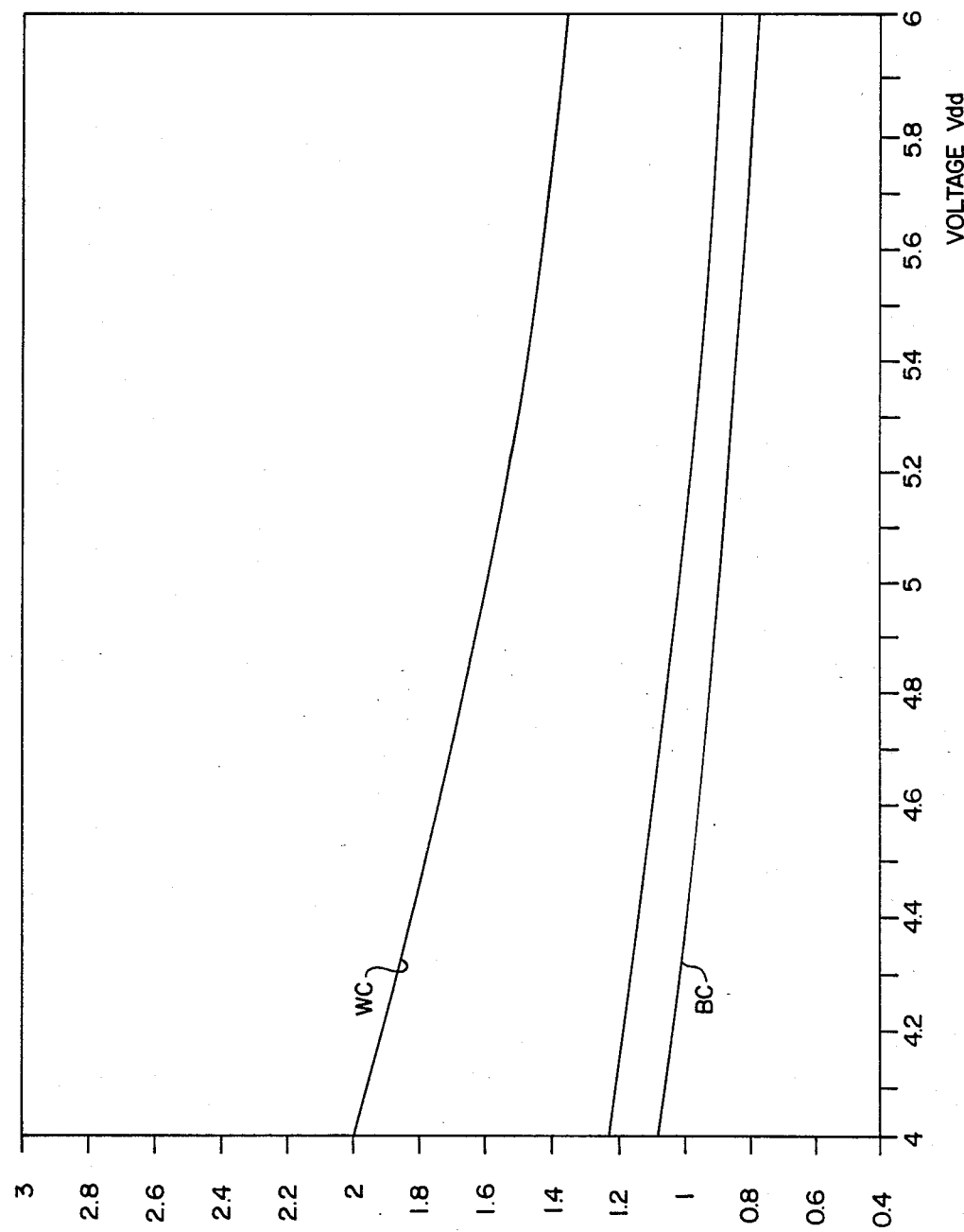
FIG. 13 is an example graph of the stage delay for a stage in the free-running pseudo-random number generator, as a function of the power supply voltage Vdd.

FIG. 1 is a logic block diagram of the first embodiment of the invention, of a sampled linear feedback shift register random number generator, with a free-running ring oscillator. The N-stage linear feedback shift register 20 consists of a serially connected sequence of shift register elements which can be, for example, D-type flip-flops such as are shown in the circuit diagram of FIG. 3A, connected with the "Q" output from a previous stage applied to the "D" input of the next stage, as is illustrated in the schematic diagram of FIG. 3B. The shift register stages 1, 2, ..., i, i+1, ..., n of the linear feedback shift register 20 of FIG. 1, are clocked by the ring oscillator 22 having an output frequency $f_0$, as is shown in the schematic diagram of FIG. 2. The free-running ring oscillator 22 can be for example a cascaded sequence of complementary MOS inverters as shown in FIG. 2. The drain voltage Vdd and the ground potential Gnd are supplied by the power supply 40 as shown in FIG. 2. Power supplies are never made to produce a perfectly constant DC voltage, and a typical power supply voltage is shown in FIG. 14. Typical power supplies used for powering large scale integrated circuits will operate at a tolerance of approximately ±10 percent. In a CMOS technology where the nominal Vdd to ground potential difference is 5 volts, the variation in the power supply voltage over time will be approximately ±0.5 volts. The frequency of the voltage variation is random and is produced by noise on the power supply and supply lines itself, and is also produced by on-chip noise sources 40' which include the switching of other circuits on the same semiconductor chip. The aggregate of all such switching and noise is a relatively high frequency randomly changing noise waveform which is added to the constant nominal value for the power supply voltage Vdd. Reference to FIG. 13 will illustrate the consequence of having a time varying value for Vdd from the power supply 40. FIG. 13 is a graph of the delay per inverter stage in a cascaded inverter sequence of a ring oscillator, as a function of variations in the power supply voltage Vdd. It can be seen that even in the best case BC for CMOS inverter ring oscillator, that the delay per stage can vary by approximately 10 percent when the power supply voltage varies by approximately 10 percent. In the worse case depiction WC for circuit behavior shown in FIG. 13, the variation can be larger than ±10 percent. As a consequence, the frequency $f_0$ produced by the ring oscillator 22 is not a constant value but varies in an unpredictable manner.

When the frequency $f_0$ from the ring oscillator 22 is used to clock the D-type flip-flop delay elements in the linear feedback shift register 20 of FIG. 1, the result is that the rate of production of pseudo-random numbers in the bit stream output by the linear feedback shift register varies over time. The output of the linear feedback shift register 20 can be connected at the node 24 which is the output of the exclusive OR 23, or alternately it can be connected to the input node 24' to the exclusive OR 23 which is connected to the output of the Nth or last stage of the linear feedback shift register 20.

In either case, the output of the linear feedback shift register 20 is connected to the D input of the D-type flip-flop 26 which is used to sample the output of the linear feedback shift register.

Linear feedback shift registers are well-known in the prior art to produce pseudo-random number sequences. This is described for example in an article by F. J. MacWilliams, et al., in an article entitled "Pseudo-Random Sequences and Arrays," *Proceedings of the IEEE,* Vol. 64, No. 12, December 1976, pp. 1715–1730. In the MacWilliams, et al. article, a number of example pseudo-random number generators based upon linear feedback shift registers are described. The linear feedback shift register produces a serial bit stream whose binary numeric value is a sequence of pseudo-random numbers which have a natural period of repetition. The larger the number of delay stages in the linear feedback shift register used in the pseudo-random number generator, the larger will be the number of pseudo-random numbers in the sequence before the periodic repetition occurs. If an attacker is able to identify the type of linear feedback shift register being employed to produce the pseudo-random number sequence, and if the attacker is able to intercept one of the pseudo-random number values, the attacker will then be able to predict the next occurring pseudo-random number values by knowing where the generator is in the production of the pseudo-random number sequence.

However, in accordance with the invention, sampling the D flip-flop 26 at a low frequency prevents the attacker from seeing every bit of the shift register. The idea is to sample at a low frequency so that all the bits can be flushed through before another sample is taken. This minimizes the information that can get to the outside world. In addition, by introducing a race condition at the sampling flip-flop 26, a degree of unpredictability is created in the production of pseudo-random number values so that an attacker will find it more difficult to predict next values based merely on the interception of an existing produced value. This is accomplished by sampling the asynchronous output of the pseudo-random number values from the linear feedback shift register of FIG. 1, with a periodic sampling signal produced by an external clock on line 25. A periodic external sampling signal is input on line 25 and its frequency can be reduced by applying it to the counter 28, so that an effective clocking signal is output from the counter 28 and applied to the clock input of the D-type flip-flop 26. The frequency f of the clocking signal applied by the counter 28 to the sampling flip-flop 26 should be smaller than the frequency with which the linear feedback shift register will cycle a signal from its first stage 1 through its last stage N, that is f should be less than f0 divided by n. The low frequency sampling by the external clock signal prevents discovery of the shift register state, which would be needed by an attacker to break the system. The counter 28 logic circuits will fail to respond (because they are not fast enough) if an attacker attempts to run the external clock frequency high enough to sample every shift register bit. The resultant sampled values for the pseudo-random number sequence produced by the linear feedback shift register 20, are then output at the Q output of the sampling flip-flop 26, on the random number output line 32. This is a serial bit stream which represents a pseudo-random number sequence which has an unpredictable sequence of values, by virtue of the periodic sampling of the asynchronous output of the linear feedback shift register 20.

The vulnerability of the circuit of FIG. 1 to attack by an eavesdropper is minimized further by physically positioning the circuit of FIG. 1 on an integrated circuit chip 30 so as not to allow any of the linear feedback shift register 20 to be made available at an input/output pin on the chip. This can be done by allowing no testing of the shift register stages in the linear feedback shift register 20, such as conventional level sensitive scan design (LSSD) testing. In addition, the ring oscillator frequency for the free-running ring oscillator 22, must not be related to the external input clock on line 25 which is applied to the counter 28. This is accomplished by making the ring oscillator 22 inaccessible from outside the chip. One way to make the circuit of FIG. 1 difficult to tamper with is to form it on the bottom side of the chip, as is the custom with flip chip bonding technology.

In circumstances where an all-zeros condition may occur in the delay stages 1 through N of the linear feedback shift register 20 of FIG. 1, during the powering up of the circuit, or alternately as a noise transient condition, additional peripheral circuitry can be included to detect and correct for the all-zeros condition.

Figure 4:
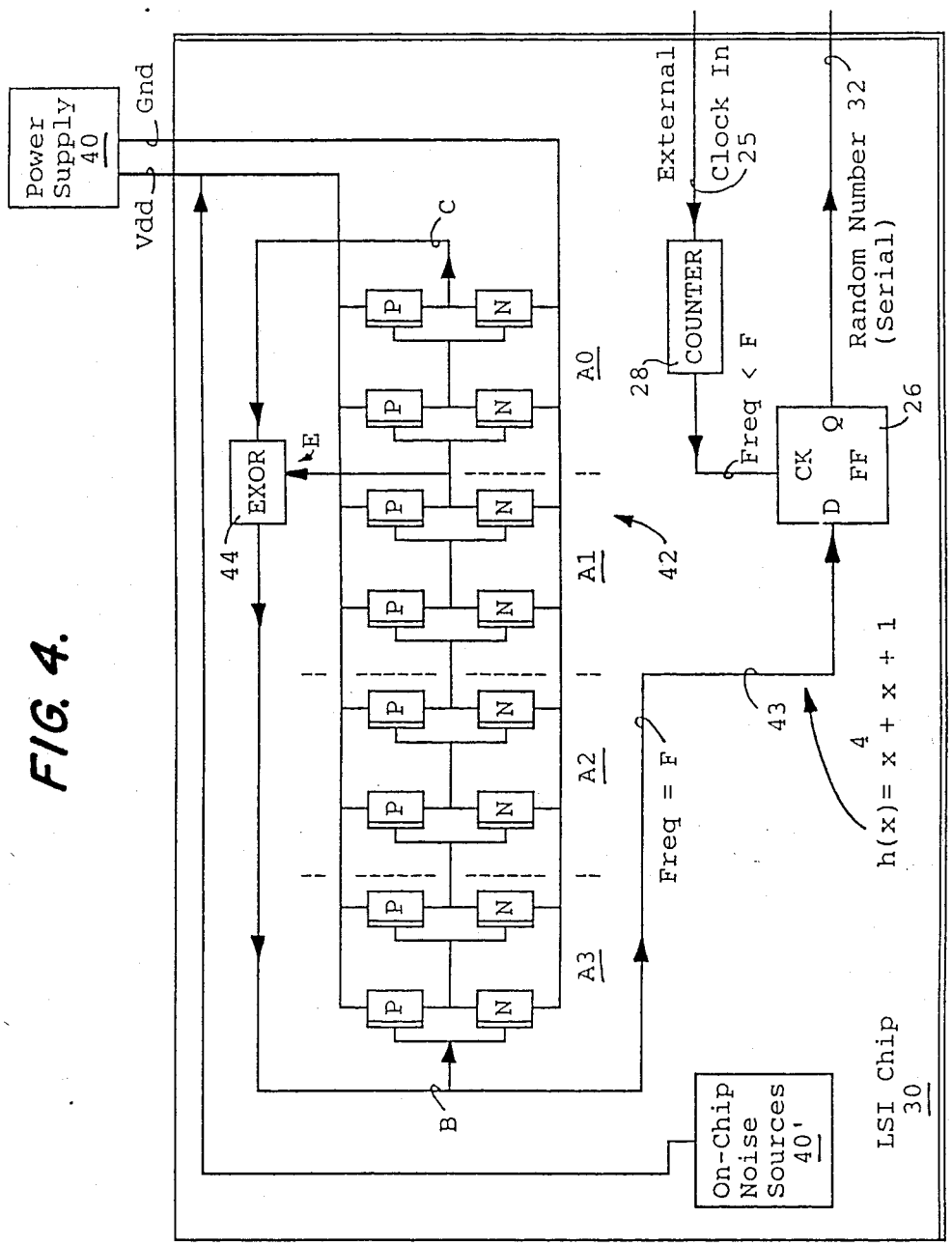
FIG. 4 is a circuit and logic block diagram of a second embodiment of the invention, showing the free-running pseudo-random number generator which is sampled at node B.

FIG. 4 shows a second embodiment of the invention which is a free-running pseudo-random number generator which has the feedback loop from the cascaded delay stages of the ring oscillator 22 of FIG. 1, connected through an exclusive OR stage 44 to produce the pseudo-random number sequence. This is shown in FIG. 4 where a cascaded sequence of inverter stages A0 through A3 are connected to form the sequence of delay stages in the free-running pseudo-random number generator 42. The output node C from the circuit 42 is connected as one input to a two-input exclusive OR 44. The other input E to the exclusive OR 44 is connected to the output of one of the delay stages A1 through A3 of the circuit 42. This topology is the same as that for a conventional linear feedback shift register and the binary bit stream at either node B or node C will be a pseudo-random number sequence. Node B can then be employed as the output node in FIG. 4 which is connected over line 43 to the D input of a D-type flip-flop 26, in a manner similar to that described for the circuit of FIG. 1.

Figure 7:
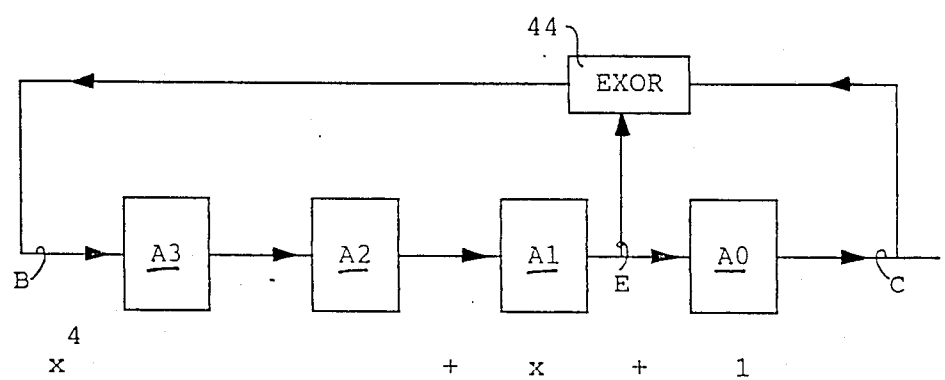
FIG. 7 is a logic block diagram of the free-running pseudo-random number generator with four delay stages A0 through A3 and a single exclusive OR block.
Figures 11A, 11B:
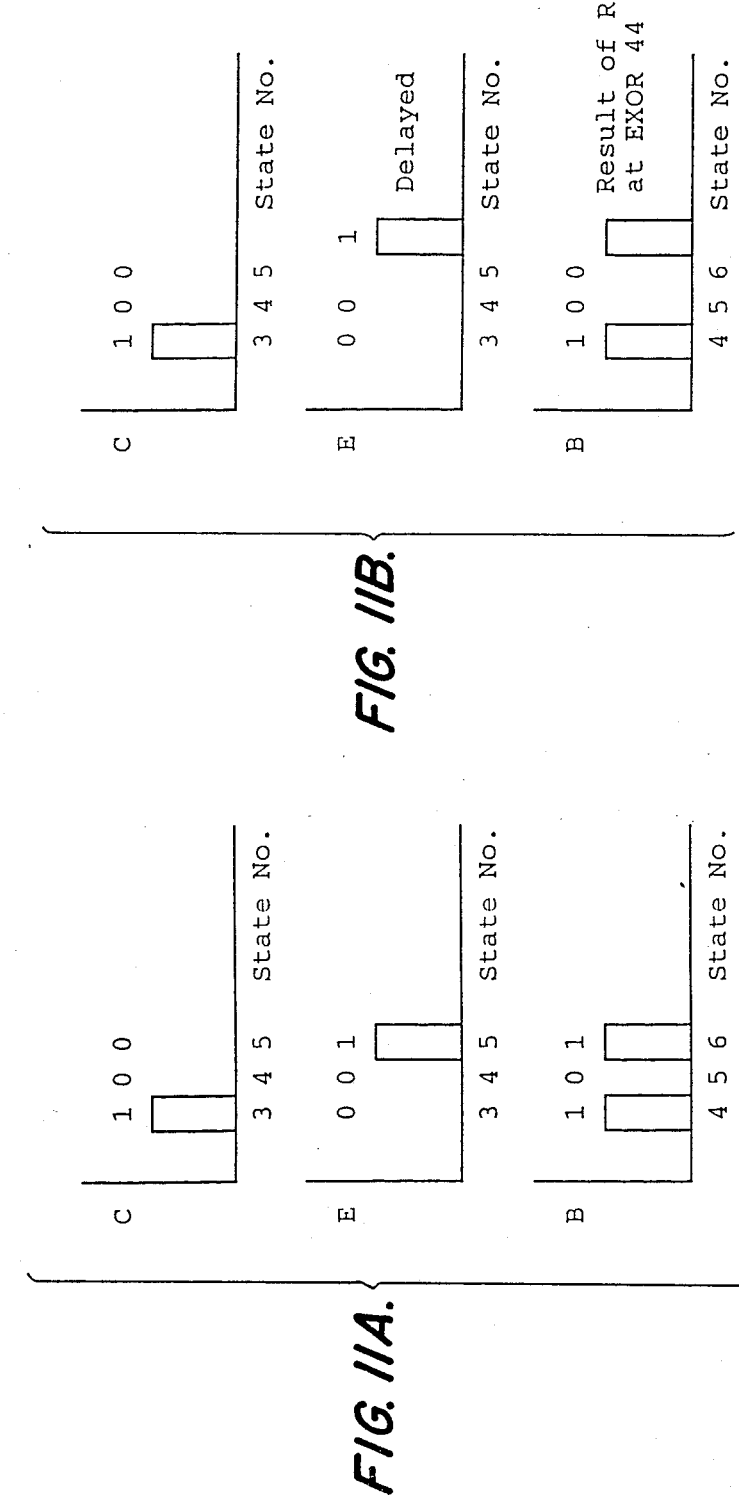
FIG. 11A is a timing diagram illustrating the operation of the free-running pseudo-random number generator circuit of FIG. 7, for nominal delays.
FIG. 11B shows the operation of the circuit of FIG. 7 with unbalanced delays.
Figure 12:
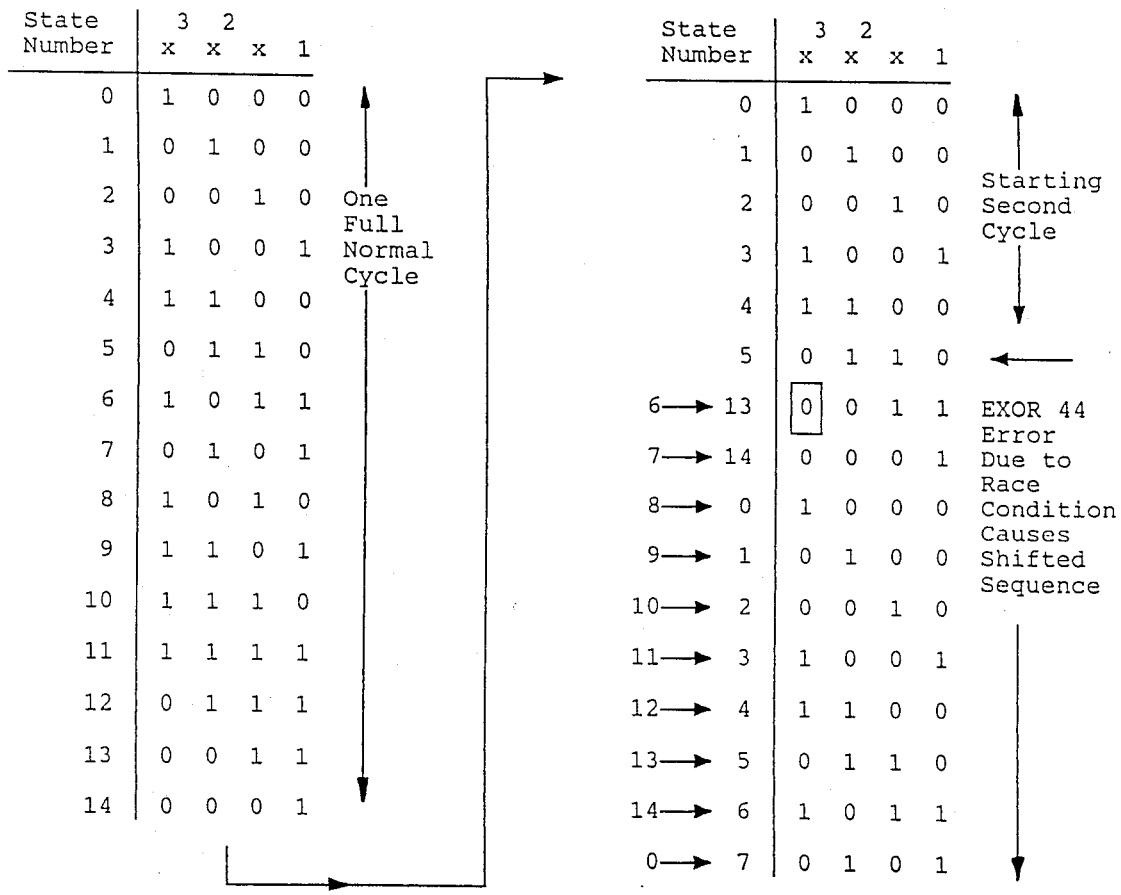
FIG. 12 is a table illustrating the sequence of pseudo-random number values which are produced by the free-running pseudo-random number generator, and further illustrates the skipping in the sequence produced when an unbalanced delay occurs.

The operation of the free-running pseudo-random number generator circuit of FIG. 4 has an additional feature which is not present in the sampled linear feedback shift register embodiment of FIG. 1. Occasionally, a race condition will occur between the two inputs to the exclusive OR circuit 44, due to the unbalanced delays which can occur in the delay stages A0 through A3 for the circuit 42, due to the time variation of the power supply voltage from the power supply 40. This can be shown by an example of the operation of the free-running pseudo-random number generator of FIG. 4, as is illustrated in FIGS. 11A, 11B and 12. The free-running pseudo-random number generator circuit of FIG. 4 can be simplified in its illustration by using a logic diagram such as that in FIG. 7, which depicts the respective stages A0 through A3 as simple delay blocks in a linear feedback shift register representation. FIG. 12 is a table showing the sequence of pseudo-random number values which will occur during normal operation of the circuit of FIG. 7. As can be seen, there is a natural periodicity of 15 states of four binary bits per state, before the sequence is repeated. The normal operation for states 3, 4 and 5 is shown in FIG. 11A, where nominal delays have occurred in the delay stages A0 through A3. In the fifth state, the expression produced by the circuit of FIG. 7 is 0110. The delay stage A1 will apply a binary value one (x) to a first input E of the exclusive OR 44 and the delay stage A0 will apply a binary value zero to the second input C of the exclusive OR 44. Under normal operation, this will produce an exclusive OR output at B of a binary one and this can be seen as the first bit ($x^3$) for the state 6 of the pseudo-random number sequence in FIG. 12. However, if an unbalanced delay occurs in the signal propagation in the stages A0 through A3, due to a time variation in the power supply value Vdd or due to other variations in circuit parameters, a race condition can occur at the two inputs E and C to the exclusive OR 44. For example, if the output on E from the stage A1 is delayed with respect to the output on C from the stage A0, as is illustrated in FIG. 11B, then the exclusive OR circuit 44 can erroneously produce a binary value of zero at its output. This is shown in the table of FIG. 12 where the state following state 5 is no longer the intended state 6 of the binary sequence 1011 for the pseudo-random number sequence, but instead becomes state 13, that is it becomes the binary sequence 0011. This unpredictable shift in the position of the pseudo-random number sequence creates an additional level of unpredictability in the pseudo-random number sequence produced by the circuit, in accordance with the invention.

The output of the free-running pseudo-random number generator 42 is applied over line 43 to the sampling flip-flop 26, at the D input. The flip-flop 26 is driven at a periodic clock frequency by the external clock signal on line 25, through the counter 28. The frequency of clocking should be less than the frequency F for the production of pseudo-random number values which have cycled through the full complement of delay stages A0 through A3. In other words, the sampling flip-flop 26 circuit samples at a frequency whose period is longer than the duration required for a signal to propagate through all the delay stages A0, A1, A2 and A3 in circuit 42. The synchronous sampling of the asynchronously produced bit stream on line 43 by the sampling flip-flop 26, produces the same type of unpredictability in the output on the output line 32 as was described previously for the sampled linear feedback shift register embodiment of FIG. 1.

The invention of FIG. 4 thus has two sources for random production of pseudo-random number values, the first being the race condition which occurs at the inputs to the exclusive OR 44 and the second is the race condition which occurs between the asynchronous occurrence of signals on line 43 and the periodic sampling signal from the input clock line 25, as they are applied to the sampling flip-flop 26. The resulting pseudo-random number sequence has a level of unpredictability which makes it very difficult for an attacker to anticipate subsequent values produced by the circuit.

Figure 6A:
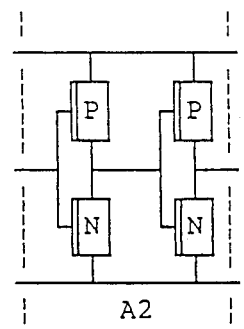
FIG. 6A shows a circuit schematic diagram of one stage A2 in the free-running pseudo-random number generator, where the stage consists, of two cascaded inverters.
Figure 6B:
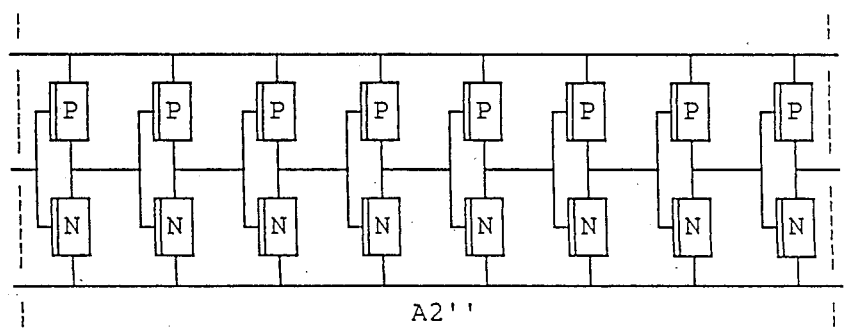
FIG. 6B is an alternate embodiment A2" of the stage A2 for the free-running pseudo-random number generator, showing eight inverters connected in cascade.

FIG. 6A shows a two inverter per stage ring oscillator delay stage element A2. The delay stages A2, etc. should, at a minimum, be at least two inverters connected in cascade. Any even number of inverters will be sufficient to produce the desired delay per stage with the preservation of the polarity of the signal between the input and the output of the delay stage. The number of inverters per stage can be increased and FIG. 6B shows an eight inverter per stage example A2''. It has been found that between six to ten inverters per stage provide a reasonably good operation for the invention. Each delay element A0, A1, A2, A3 of FIG. 4 must have a sufficiently fast rise and fall time characteristic so that the steady state for an input signal is always reached before the next input signal transition begins. Otherwise, the effective delay of each element A0, A1, A2, A3 will be reduced. If this were to happen, the arrival times of the signals at the inputs to the exclusive OR 44 will be disturbed. Proper response can be assured by requiring that the time duration of each delay stage A0, A1, A2 and A3 is sufficiently long, which can be achieved by having a sufficiently long delay-to-rise time ratio in each delay element. The delay-to-rise time ratio for each element A0, A1, A2 and A3 should be at least three-to-one, and more like five-to-one. Thus, each delay stage A0, A1, A2 and A3 in the circuit 42 of FIG. 4 should optimally consist of at least six, but perhaps more like ten inverters per stage, depending upon the semiconductor technology employed to form the circuits on the integrated circuit chip 30.

Figure 5:
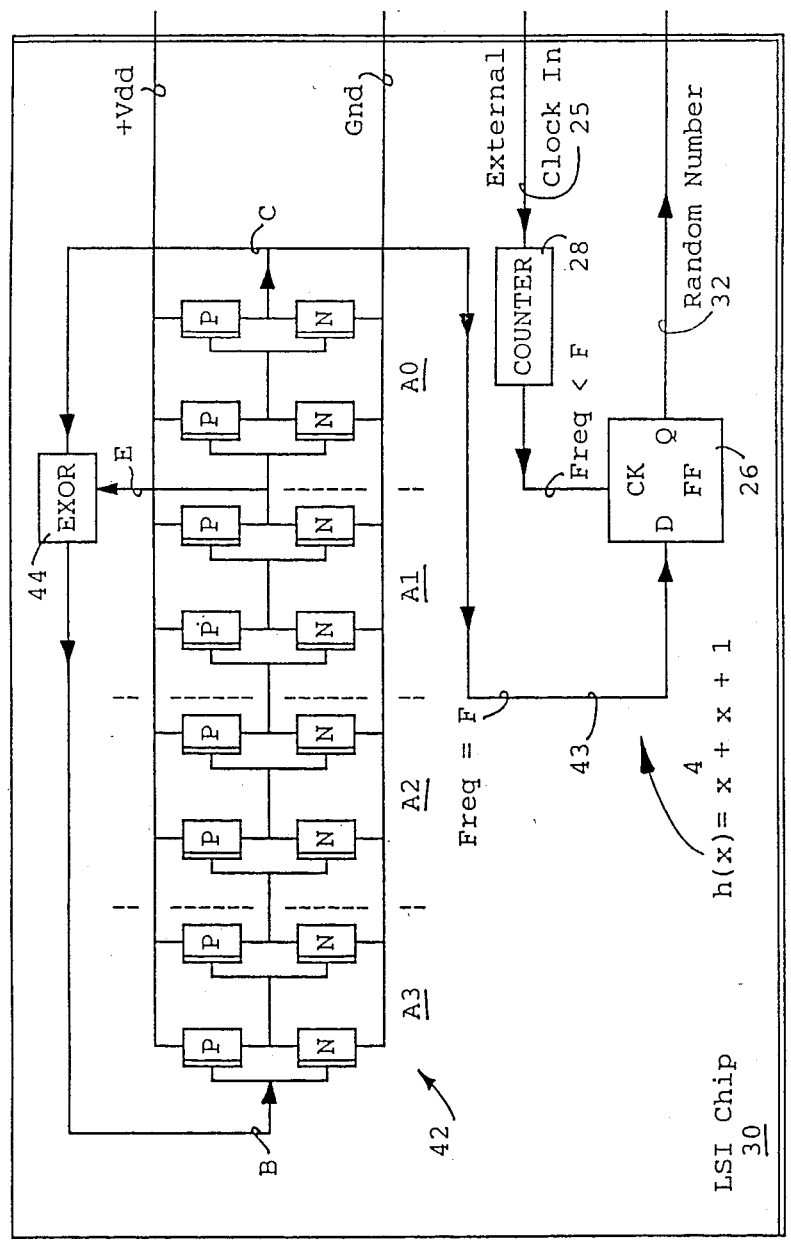
FIG. 5 is a variation of the circuit shown in FIG. 4, illustrating the free-running pseudo-random number generator sampled at node C.

FIG. 5 is a variation of the circuit of FIG. 4, which is sampled at the node C, instead of the node B, as is shown in FIG. 4. Such sampling is logically the same, since the value of a binary signal which starts at node B and propagates through the cascaded sequence of stages A3, A2, A1 and A0 in the circuit 42, will ultimately be produced with the same polarity at the node C.

Figure 8:
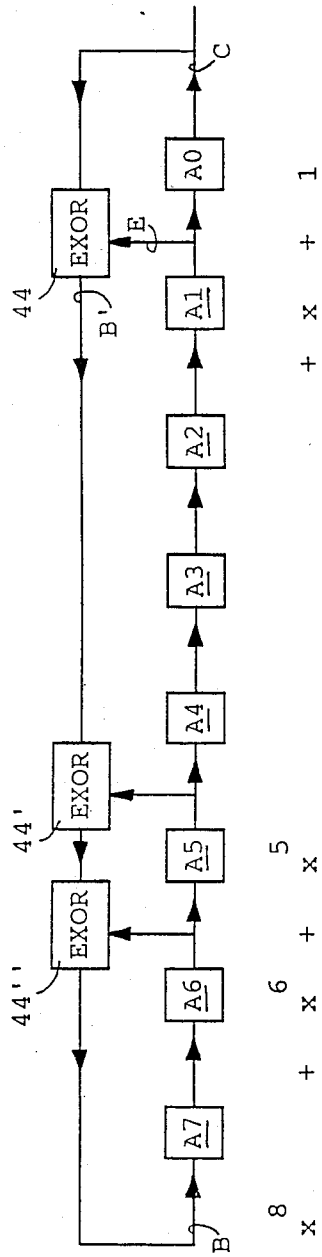
FIG. 8 is an alternate embodiment for the free-running pseudo-random number generator, showing eight delay stages A0 through A7 and three exclusive OR logic blocks.

FIG. 8 is another embodiment for the circuit 42 of FIGS. 4 and 5, which employs eight delay stages A0 through A7, instead of the four delay stages shown in FIGS. 4 and 5. It can also be seen that three exclusive OR circuits 44, 44' and 44'' are provided in the circuit of FIG. 8 instead of the single exclusive OR circuit as is shown in FIG. 7. The variety of linear feedback shift register configurations which can be embodied in the free-running pseudo-random number generator circuit 42, is a wide variety, as is indicated by the examples shown in the MacWilliams, et al. article referenced above. In each example pseudo-random number generator, the time variation of the power supply voltage as applied to the inverters making up the delay stages in the circuit 42, will produce race conditions which will occur at the inputs of each exclusive OR device 44, 44', 44'', etc., producing the unpredictable skipping from a first portion of the pseudo-random number sequence to a second portion, in accordance with the invention.

Figure 9:
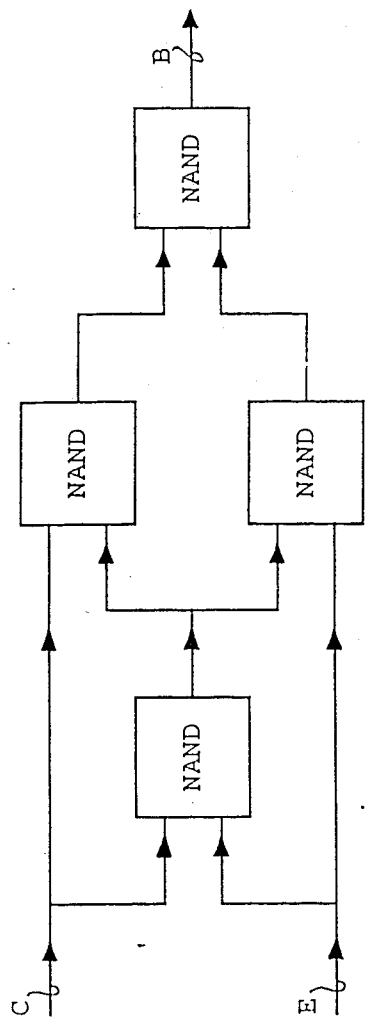
FIG. 9 is a logic block diagram of an exclusive OR circuit.

FIG. 9 is a logic block diagram of an exclusive OR circuit which is comprised of four NAND two-input devices connected as shown. This is an example of an exclusive OR circuit 44.

Figure 10:
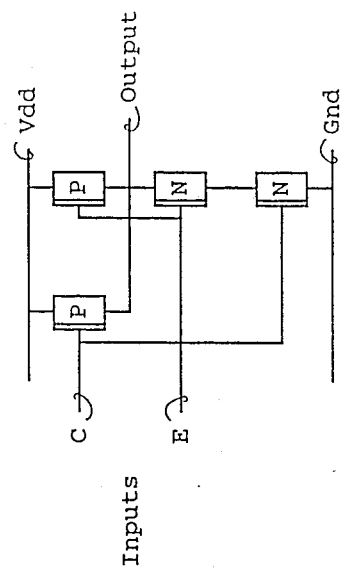
FIG. 10 is a circuit diagram of a NAND circuit.

FIG. 10 is a circuit schematic diagram of a CMOS circuit for producing a NAND logic function such as would be used in the NAND logic blocks of FIG. 9.

The resulting invention produces unpredictable sequences of pseudo-random numbers which prevent an attacker from anticipating subsequent values in the output bit stream. This finds particular application in cryptography where the production of random numbers which are not predictable, is essential in the creation of master key values used for cryptographic operations. The invention disclosed herein produces a reliable source of unpredictable random number sequences which can be employed for high security applications in cryptography.

Although specific embodiments of the invention have been disclosed, it will be understood by those having skill in the art that changes can be made to those specific embodiments without departing from the spirit and the scope of the invention.

What is claimed is:

1. A random number generator circuit, formed on an integrated circuit chip, said chip having power supply voltage which randomly varies with respect to time, comprising:

a plurality of n delay stages serially connected in a sequence with a feedback input at a first stage in said sequence and a feedback output at a last stage in said sequence, each stage including at least two inverter circuits, each inverter circuit having a power supply input terminal;

an exclusive OR circuit coupled in a feedback path between said feedback output of said last stage and said feedback input of said first stage;

said plurality of n delay stages being divided into a first subplurality of i stages, having a first output coupled as a first input to said exclusive OR circuit;

said plurality of n delay stages having a second subplurality of n minus i stages in said plurality of stages, with said feedback output coupled as a second input to said exclusive OR circuit;

said exclusive OR circuit generating a pseudo-random signal pattern at the output thereof in response to inputs from said first and second subpluralitys of delay stages;

each said delay stage in said plurality of n delay stages propagating signals which traverse consecutive ones of said delay stages, each said delay stage applying a randomly varying magnitude of signal propagation delay to said signals in response to said randomly varying power supply voltage applied to said delay stages, resulting in randomly occurring race conditions between said first and second inputs of said exclusive OR circuit;

said exclusive OR circuit randomly changing said pseudo-random signal pattern in response to said randomly occurring race conditions, and;

a sampling circuit having an input connected to said feedback output of said second subplurality of stages, for periodically sampling the binary state at said feedback output of said second subplurality of stages;

whereby said sampling circuit outputs a pseudo-random signal pattern which randomly changes with time.

2. The apparatus of claim 1, wherein said sampling circuit samples at a frequency whose period is longer than the duration required for a signal to propagate through said n delay stages.

3. A random number generator circuit, formed on an integrated circuit chip, said chip having power supply voltage which randomly varies with respect to time, comprising:

a plurality of n delay stages serially connected in a sequence with a feedback input at a first stage in said sequence and a feedback output at a last stage in said sequence, each stage including at least two inverter circuits, each inverter circuit having a power supply input terminal;

an exclusive OR circuit coupled in a feedback path between said feedback output of said last stage and said feedback input of said first stage;

said plurality of n delay stages being divided into a first subplurality of i stages, having a first output coupled as a first input to said exclusive OR circuit;

said plurality of n delay stages having a second subplurality of n minus i stages in said plurality of stages, with said feedback output coupled as a second input to said exclusive OR circuit;

said exclusive OR circuit generating a pseudo-random signal pattern at the output thereof in response to inputs from said first and second subpluralities of delay stages;

each said delay stages in said plurality of n delay stages propagating signals which traverse consecutive ones of said delay stages, each said delay stage applying a randomly varying magnitude of signal propagation delay to said signals in response to said randomly varying power supply voltage applied to said delay stages, resulting in randomly occurring race conditions between said first and second inputs of said exclusive OR circuit;

said exclusive OR circuit randomly changing said pseudo-random signal pattern in response to said randomly occurring race conditions, and;

a sampling circuit having an input connected to the output of said second subplurality of stages, for periodically sampling the binary state at the output of said second subplurality of stages;

whereby said sampling circuit outputs a pseudo-random signal pattern which randomly changes with time.

4. The apparatus of claim 3, wherein said sampling circuit samples at a frequency whose period is longer than the duration required for a signal to propagate through said n delay stages.

5. A random number generator circuit, formed on an integrated circuit chip, said chip having a power supply voltage which randomly varies with respect to time, comprising:

a free-running ring oscillator, having a plurality of inverter circuits connected in cascade and having an output, each inverter circuit having a power supply input terminal;

a feedback shift register having a plurality of n delay stages serially connected in a sequence with a feedback path, each stage having a clock input connected to said output of said ring oscillator, said stages being divided into a first subplurality of i stages, having an output coupled as a first input to an exclusive OR device;

said feedback shift register having a second subplurality of n minus i stages in said plurality of stages, with an output coupled as a second input to said exclusive OR circuit;

a sampling circuit having an input coupled to said feedback path, for periodically sampling the binary state of a pseudo-random signal pattern output by said exclusive OR circuit;

each said inverter circuit in said ring oscillator propagating an oscillator signal which traverses consecutive ones of said inverter circuits, each said inverter circuit applying a randomly varying magnitude of signal propagation delay to said oscillator signal in response to said randomly varying power supply voltage applied to said inverter circuits, resulting in an oscillator signal output from said ring oscillator with a randomly varying frequency;

said sampling of said pseudo-random signal pattern by said sampling circuit randomly changing in response to said randomly varying ring oscillator frequency; and whereby said sampling circuit outputs a pseudo-random signal pattern which randomly changes with time.

6. The apparatus of claim 5, which further comprises:

said sampling circuit having an input connected to the output of said second subplurality of stages, for periodically sampling the binary state at the output of said second subplurality of stages;

whereby said sampling circuit outputs a pseudo-random signal pattern which randomly changes with time.

7. The apparatus of claim 6, wherein said sampling circuit samples at a frequency whose period is longer than the duration required for a signal to propagate through said n delay stages.

8. The apparatus of claim 5, which further comprises:
said sampling circuit having an input connected to the output of said exclusive OR circuit, for periodically sampling the binary state at the output of said exclusive OR circuit;
whereby said sampling circuit outputs a pseudo-random signal pattern which randomly changes with time.

9. The apparatus of claim 8, wherein said sampling circuit samples at a frequency whose period is longer than the duration required for a signal to propagate through said n delay stages.

* * * * *